United States Patent
Kang et al.

(10) Patent No.: US 10,435,293 B2
(45) Date of Patent: Oct. 8, 2019

(54) METHODS OF MANUFACTURING ENERGY CONVERSION MATERIALS FABRICATED WITH BORON NITRIDE NANOTUBES (BNNTS) AND BNNT POLYMER COMPOSITES

(75) Inventors: Jin Ho Kang, Newport News, VA (US); Cheol Park, Yorktown, VA (US); Joycelyn S. Harrison, Hampton, VA (US); Michael W. Smith, Newport News, VA (US); Sharon E. Lowther, Arlington, VA (US); Jae-Woo Kim, Newport News, VA (US); Godfrey Sauti, Hampton, VA (US)

(73) Assignees: National Institute of Aerospace Associates, Hampton, VA (US); The United States of America as represented by the Administrator of NASA, Washington, DC (US)

( * ) Notice: Subject to any disclaimer, the term of this patent is extended or adjusted under 35 U.S.C. 154(b) by 343 days.

(21) Appl. No.: 12/925,047

(22) Filed: Oct. 13, 2010

(65) Prior Publication Data
US 2011/0192016 A1    Aug. 11, 2011

Related U.S. Application Data (60) Provisional application No. 61/278,866, filed on Oct. 13, 2009.

(51) Int. Cl.
*B82Y 40/00* (2011.01)
*B82Y 30/00* (2011.01)
(Continued)

(52) U.S. Cl.
CPC ............ *B82Y 40/00* (2013.01); *B82Y 30/00* (2013.01); *H01L 41/00* (2013.01); *H01L 41/082* (2013.01);
(Continued)

(58) Field of Classification Search
CPC ......... B82Y 40/00; B82Y 30/00; H01L 41/00; H01L 41/37; H01L 41/293;
(Continued)

(56) References Cited

U.S. PATENT DOCUMENTS

| 3,261,800 A | 7/1966 | Collins |
| 3,673,118 A | 6/1972 | Mandorf et al. |

(Continued)

FOREIGN PATENT DOCUMENTS

| JP | 01288200 A | * 11/1989 | ............... 29/23.35 |
| JP | 2004195718 A | * 7/2004 | |

(Continued)

OTHER PUBLICATIONS

Machine Language Translation (English) of Japanese Patent Publication, JP 2007-137720, Jul. 2013.*

(Continued)

*Primary Examiner* — A. Dexter Tugbang (57) ABSTRACT

Formation of a boron nitride nanotube nanocomposite film by combining a boron nitride nanotube solution with a matrix such as a polymer or a ceramic to form a boron nitride nanotube/polyimide mixture and synthesizing a boron nitride nanotube/polyimide nanocomposite film as an electroactive layer.

26 Claims, 8 Drawing Sheets

(51) Int. Cl.
*H01L 41/08* (2006.01)
*H01L 41/293* (2013.01)
*H01L 41/00* (2013.01)
*H01L 41/37* (2013.01)
*G01R 29/14* (2006.01)

(52) U.S. Cl.
CPC ........ *H01L 41/0805* (2013.01); *H01L 41/293* (2013.01); *H01L 41/37* (2013.01); *G01R 29/14* (2013.01); *Y10T 29/42* (2015.01); *Y10T 29/49002* (2015.01); *Y10T 29/49005* (2015.01); *Y10T 29/49155* (2015.01)

(58) Field of Classification Search
CPC ... H01L 41/0805; H01L 41/082; Y10T 29/42; Y10T 29/49005; Y10T 29/49155; Y10T 29/49002; G01L 29/14
USPC ....... 29/25.35, 846, 594; 977/753, 842, 847, 977/882, 890, 891; 523/200; 901/36; 324/457; 252/62.9 R, 62.9 PZ
See application file for complete search history.

(56) References Cited

U.S. PATENT DOCUMENTS

| | | | |
|---|---|---|---|
| 5,707,471 | A | 1/1998 | Petrak et al. |
| 6,478,994 | B1 | 11/2002 | Sneddon et al. |
| 6,689,674 | B2 * | 2/2004 | Zhang et al. ............. 977/847 X |
| 6,774,074 | B2 | 8/2004 | Rousseau et al. |
| 6,805,390 | B2 * | 10/2004 | Nakayama et al. ......... 901/36 X |
| 6,806,795 | B2 * | 10/2004 | Shin ........................ 29/25.35 X |
| 6,838,162 | B1 | 1/2005 | Gruber et al. |
| 7,026,432 | B2 * | 4/2006 | Charati et al. ............ 977/753 X |
| 7,041,620 | B2 | 5/2006 | Smalley et al. |
| 7,229,747 | B2 * | 6/2007 | Park et al. ................ 977/842 X |
| 8,206,674 | B2 | 6/2012 | Smith et al. |
| 8,436,130 | B2 | 5/2013 | Cote et al. |
| 9,845,269 | B2 | 12/2017 | Kang et al. |
| 2003/0158323 | A1 | 8/2003 | Connell et al. |
| 2004/0004196 | A1 | 1/2004 | DeMeo et al. |
| 2005/0001205 | A1 | 1/2005 | Malalel et al. |
| 2005/0211930 | A1 | 9/2005 | DeMeo et al. |
| 2006/0008676 | A1 | 1/2006 | Ebata et al. |
| 2006/0057050 | A1 | 3/2006 | Ren et al. |
| 2006/0084752 | A1 | 4/2006 | Ounaies et al. |
| 2006/0169996 | A1 | 8/2006 | D'Evelyn et al. |
| 2007/0102672 | A1 | 5/2007 | Hamilton |
| 2007/0199729 | A1 * | 8/2007 | Siegel et al. .............. 523/200 X |
| 2008/0197853 | A1 * | 8/2008 | Swift et al. .................... 324/457 |
| 2008/0275172 | A1 | 11/2008 | Wise et al. |
| 2009/0117021 | A1 | 5/2009 | Smith et al. |
| 2009/0221734 | A1 | 9/2009 | Kuwahara et al. |
| 2009/0230353 | A1 | 9/2009 | Shimazu et al. |
| 2010/0051879 | A1 | 3/2010 | Sainsbury et al. |
| 2010/0102279 | A1 | 4/2010 | Kim et al. |
| 2011/0068291 | A1 | 3/2011 | Park et al. |
| 2012/0107594 | A1 | 5/2012 | Kang et al. |
| 2012/0186742 | A1 | 7/2012 | Kang et al. |
| 2013/0119316 | A1 | 5/2013 | Sauti et al. |

FOREIGN PATENT DOCUMENTS

| | | | |
|---|---|---|---|
| JP | 2007137720 | A * | 6/2007 |
| JP | 2007146039 | A | 6/2007 |
| JP | 2007290929 | A * | 11/2007 |
| JP | 2008143743 | A | 6/2008 |
| JP | 2008222964 | A | 9/2008 |
| JP | 2008538136 | A | 10/2008 |
| JP | 2008266101 | A | 11/2008 |
| JP | 2009161657 | A | 7/2009 |
| JP | 2010527320 | A | 8/2010 |
| JP | 2012523452 | A | 10/2012 |
| JP | 2013507324 | A | 3/2013 |
| JP | 2013535002 | A | 9/2013 |
| WO | WO 2008/067137 | A2 | 9/2008 |
| WO | 2008123326 | A1 | 10/2008 |
| WO | WO 2011/139384 | A1 | 11/2011 |

OTHER PUBLICATIONS

Machine Language Translation (English) of JP 2004-195718, Mar. 2014.*
Office Action in Canadian Patent Application No. 2,777,666, dated Oct. 24, 2016.
Office Action in Canadian Patent Application No. 2,777,666, dated Sep. 25, 2017.
Office Action in Canadian Patent Application No. 2,777,666, dated Sep. 14, 2018.
Office Action in European Patent Application No. 10823735.5, dated Sep. 22, 2017.
Office Action in European Patent Application No. 10823735.5, dated Sep. 21, 2018.
Office Action in U.S. Appl. No. 13/694,325, dated Jun. 16, 2015.
Office Action in U.S. Appl. No. 13/694,325, dated Mar. 29, 2016.
Office Action in U.S. Appl. No. 13/694,325, dated Jan. 18, 2017.
Office Action in U.S. Appl. No. 13/694,325, dated Aug. 17, 2017.
Office Action in U.S. Appl. No. 13/694,325, dated Mar. 19, 2018.
Office Action in U.S. Appl. No. 13/694,325, dated Oct. 25, 2018.
Office Action in Japanese Application No. 2012-534160, dated Jan. 20, 2015.
Office Action in Japanese Application No. 2012-534160, dated Feb. 20, 2015.
Office Action in Korean Application No. 10-2012-7011165, dated Oct. 31, 2016.
Office Action in Korean Application No. 10-2012-7011165, dated May 30, 2017.
Cheng, Z.Y. et al; "Effect of High Energy Electron Irradiation on the Electromechanical Properties of Poly(vinylidene Fluoride-Trifluorethylene) 50/50 and 65/35 Copolymers," IEEE Transactions on Ultrasonics, Ferroelectrics, and Frequency Control, vol. 47, No. 6.
Golberg, D. et al.; Nanotubes in Boron Nitride Laser Heated at High Pressure; Appl. Phy. Lett.; 69 (14), 2045-2047; 1996.
Golberg, D. et al.; "Boron Nitride Nanotubes," Advanced Materials, vol. 19, pp. 2413-2432, 2007 (20 pages).
Griebel et al. Molecular dynamics simulations of boron-nitride nanotubes embedded in amorphous Si—B—N. INS Preprint No. 0501, 2005.
Guillot, F.M. et al., "Electrostrictive Effect in Polyurethanes," Journal of Applied Polymer Science, vol. 9, pp. 399-404 (2003) (6 pages).
Harrison et al. "Polyethylene/Boron Composites for Radiation Shielding Applications," Space Technology and Applications International Forum, American Institute of Physics (2008) (9 pages).
Huang, C. et al., "Poly(vinylide fluoride-trifluoroethylene) Based High Performance Electroactive Polymers," IEEE Transactions on Dielectrics and Electrical Insulation, vol. 11, No. 2; Apr. 2004 (13 pages).
Kang, Jin Ho et al., "All-Organic Actuator Fabricated with Single Wall Carbon Nanotube Electrodes," Journal of Polymer Science, Part B: Polymer Physics, vol. 46, pp. 2532-2538 (2008) (7 pages).
Katsuda, Y. Reinforcement of precursor-derived Si—(B—)C—N ceramics with carbon nanotubes. Dissertation, Stuttgart, 2005.
Lee et al.; Catalyst-Free Synthesis of Boron Nitride Single-Wall Nanotubes with a Preferred Zig-Zag Configuration; Physical Review B, vol. 64, 121405; 2001.
Michalski, P.J. et al., "Continuum Theory for Piezoelectricity in Nanotubes and Nanowires," Phys. Rev. Lett. 95, 116803, Jan. 11, 2005 (4 pages).
Nakhmanson, S.M. et al., "Spontaneous polarization and piezoelectricity in boron nitride nanotubes," The American Physical Society, Physical Review, vol. B 67, 235406 (2003) (5 pages).
Park, C. et al., "Actuating Single Wall Carbon Nanotube-Polymer Composites: Intrinsic Unimorphs," Advanced Materials, vol. 20, pp. 2074-2079 (2008) (6 pages).

(56) References Cited

OTHER PUBLICATIONS

Sai, N. et al. "Microscopic theory for nanotube piezoelectricity," Physical Review B 68, 241405(R) (2003) (3 pages).
Salehi-Khojin et al: "Buckling of boron nitride nanotube reinforced piezoelectric polymeric composites subject to combined electro-thermo-mechanical loadings", Composites Science and Technology, Elsevier, UK, vol. 68, No. 6, pp. 1489-1501, Oct. 30, 2007 (14 pages).
Simpson, J.O. et al., "Novel Piezoelectric Polyimides," Materials Research Society Symposium Proceedings, vol. 413 (1996) (6 pages).
Zhang, Q.M. et al., "An experimental investigation of electromechanical responses in a polyurethane elastomer," Journal of Applied Physics, vol. 81, 2770 (1997) (8 pages).

\* cited by examiner

METHODS OF MANUFACTURING ENERGY CONVERSION MATERIALS FABRICATED WITH BORON NITRIDE NANOTUBES (BNNTS) AND BNNT POLYMER COMPOSITES

CROSS REFERENCE TO RELATED APPLICATION

The present application claims priority from U.S. Provisional Application Ser. No. 61/278,866, filed Oct. 13, 2009.

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Cooperative Agreement No. NCC-1-02043 awarded by the National Aeronautics and Space Administration.

BACKGROUND OF THE INVENTION

1. Field of the Invention

The present invention relates to high performance energy conversion devices such as sensors and electromechanical actuators, and, more particularly to energy conversion devices manufactured from boron nitride nanotubes and BNNT/polyimide composite materials.

2. Description of Related Art

Electroactive materials have been studied extensively in the last few decades for use in a variety of applications including electromechanical sensors and actuators, ultrasonic transducers, loudspeakers, sonars, medical devices, prosthetics, artificial muscles, electric energy harvesters and devices for vibration and noise control. Electroactive ceramics such as lead zirconate titanates (PZT), lead-lanthanum zirconate titanate (PLZT), and niobium-lead zirconate titanate (PNZT) have very high piezoelectric coefficients, but have poor mechanical properties (i.e., are brittle) and high toxicity. Compared to the electroactive ceramics, electroactive polymers such as poly(vinylidene fluoride) (PVDF) offer a unique combination of favorable characteristics because they are lightweight, conformable, and tough. However, they have relatively low electroactive coefficients and poor thermal properties.

Recently, a series of amorphous piezoelectric polyimides containing polar functional groups have been developed, using molecular design and computational chemistry, for potential use as sensors in high temperature applications. The piezoelectric response of these polyimides is, however, an order of magnitude smaller than that of poly(vinylidene fluoride) (PVDF). This is due to the fact that the dipoles in the polymer do not align along the applied electric field efficiently because of limited chain mobility within the imidized closed ring structure. To increase the piezoelectric response of these polymers, synthesis with various monomers, control of the poling process, and the adding of carbon nanotubes (CNTs) have been reported.

However, there are still limitations to the use of electroactive polyimide composites in many applications. For example, CNT doped polyimides have large leakage current because the CNTs are either conductors or narrow band gap semiconductors. This limits the use of the composites for high voltage devices. Furthermore, CNTs are chemically active and can be easily oxidized at elevated temperatures (above about 350° C. in air).

Novel electroactive materials have been required for increasing electroactive performance while reducing power consumption for many applications including in the aerospace field. Many electroactive materials have been proposed, but they still have problems of poor mechanical/thermal properties or unsatisfactory electroactive performance. Recently, boron nitride nanotubes (BNNTs) have been successfully synthesized, which exhibit excellent mechanical, electronic, optical, and thermal properties. BNNTs are thought to possess high strength-to-weight ratio, high temperature resistance (about 800° C. in air), and radiation shielding capabilities. Furthermore, intrinsic piezoelectricity of BNNTs has been predicted theoretically. However, no experimental result of the piezoelectric properties of BNNTs or BNNT composites has been reported as yet. In this invention, we demonstrate electroactive actuation characteristics of novel BNNT based materials. We prepared several series of BNNT based electroactive materials including BNNT/polyimide composites and BNNT films. The BNNT based electroactive materials showed high piezoelectric coefficients, $d_{13}$, about 14.80 pm/V as well as high electrostrictive coefficients, $M_{13}$, $3.21 \times 10^{-16}$ pm$^2$/V$^2$. It is anticipated that the BNNT based electroactive materials will be used for novel electromechanical energy conversion devices.

An object of the present invention is to provide high performance energy conversion devices.

An object of the present invention is to provide high performance energy conversion devices such as sensors.

Another object of the present invention is to provide high performance energy conversion devices such as electromechanical actuators.

Yet another object of the present invention is to provide high performance energy conversion devices manufactured from boron nitride nanotubes and BNNT/polyimide composite materials.

Finally, it is an object of the present invention to accomplish the foregoing objectives in a simple and cost effective manner.

SUMMARY OF THE INVENTION

The present invention addresses these needs by providing a method for forming a boron nitride nanotube nanocomposite film, including the steps of combining a boron nitride nanotube solution with a polymer or ceramic matrix to form a boron nitride nanotube/polyimide mixture and synthesizing a boron nitride nanotube/polyimide nanocomposite film as an electroactive layer. The matrix is preferably synthesized from a diamine, 2,6-bis(3-aminophenoxy) benzonitrile ((β-CN)APB) and a dianhydride, pyromellitic dianhydride (PMDA). Alternatively, the matrix is polyvinylydeneflouride, polyvinylydeneflouride copolymer, polycarbonate or epoxy. The matrix can also be a highly elastic polymer such as polyurethane or polysiloxane or a ceramic such as silicon dioxides or aluminum oxides. The concentration of boron nitride nanotubes in the boron nitride nanotube/polyimide mixture is between 0 and 100% by weight. In an additional step, the boron nitride nanotube/polyimide nanocomposite film is coated with metal electrodes formed from chrome, gold or a mixture thereof. Alternatively, the boron nitride nanotube/polyimide film is coated with compliant electrodes formed from carbon nanotubes, carbon nanotube sheet, carbon nanotube/polymer composites, gold particles, silver particles or a mixture thereof.

In one embodiment, a method for forming a boron nitride nanotube/polymer nanocomposite film, includes synthesizing a high temperature piezoelectric polyimide, combining a boron nitride nanotubes solution with the high temperature piezoelectric polyimide, using a polymer as a matrix and synthesizing a boron nitride nanotube/polyimide nanocomposite film as an electroactive layer. The polymer is dianhydride, pyromellitic dianhydride and the high temperature piezoelectric polyimide is synthesized from a diamine, 2,6-bis(3-aminophenoxy)benzonitrile (($\beta$-CN)APB) and a dianhydride, pyromellitic dianhydride (PMDA). The concentration of boron nitride nanotubes in the boron nitride nanotube/polyimide mixture is between 0 and 100% by weight. In an additional step, the boron nitride nanotube/polyimide nanocomposite film is coated with metal electrodes, preferably formed from chrome, gold or a mixture thereof. Alternatively, the boron nitride nanotube/polyimide film is coated with compliant electrodes formed from carbon nanotubes, carbon nanotube sheeting, carbon nanotube/polymer composites, gold particles, silver particles or a mixture thereof.

BRIEF DESCRIPTION OF THE DRAWINGS

A more complete description of the subject matter of the present invention and the advantages thereof, can be achieved by reference to the following detailed description by which reference is made to the accompanying drawings in which.

DETAILED DESCRIPTION OF THE PREFERRED EMBODIMENT

The following detailed description is of the best presently contemplated mode of carrying out the invention. This description is not to be taken in a limiting sense, but is made merely for the purpose of illustrating general principles of embodiments of the invention.

Since the first theoretical prediction of the existence of boron nitride nanotubes (BNNTs) in 1994 and the first experimentally synthesized BNNT report by Zettl's group in 1995, several types of BNNT synthesis methods have been reported. Recently, a new and conceptually simple method of producing extraordinarily long, highly crystalline BNNTs was demonstrated. BNNTs are thought to possess high strength-to-weight ratio, high thermal stability (up to about 800° C. in air), piezoelectricity, and radiation shielding capabilities. Nakhmanson's theoretical analysis predicted that the piezoelectric coefficient of BNNTs can be higher than that of poly(vinylidene fluoride) (PVDF) or poly(vinylidene fluoride-trifluoroethyene) P(VDF-TrFE). However, the piezoelectric properties of BNNTs or BNNT composites have not been reported experimentally as yet. In this invention, we make use of the electroactive characteristics of novel BNNT based materials.

Figure 1A:
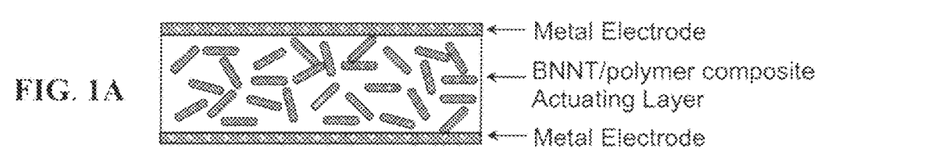
FIG. 1a shows a schematic diagram of a metal electroded BNNT/polymer composite actuator.
Figure 1B:
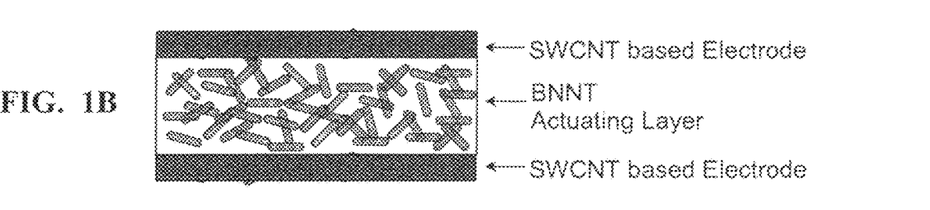
FIG. 1b shows a Schematic diagram of a carbon nanotube electroded BNNT actuator.

First, a BNNT/polyimide nanocomposite film was synthesized as an electroactive layer by in-situ polymerization under simultaneous shear and sonication. The high temperature piezoelectric polyimide, used as a matrix for this invention, was synthesized from a diamine, 2,6-bis(3-aminophenoxy)benzonitrile (($\beta$-CN)APB), and a dianhydride, pyromellitic dianhydride (PMDA). The concentrations of BNNTs in the polyimide were 0 and 2 wt %. In order to characterize electroactive properties of the composites, the samples were coated with metal (chrome/gold) electrodes for both sides (FIG. 1a).

Figure 2A:
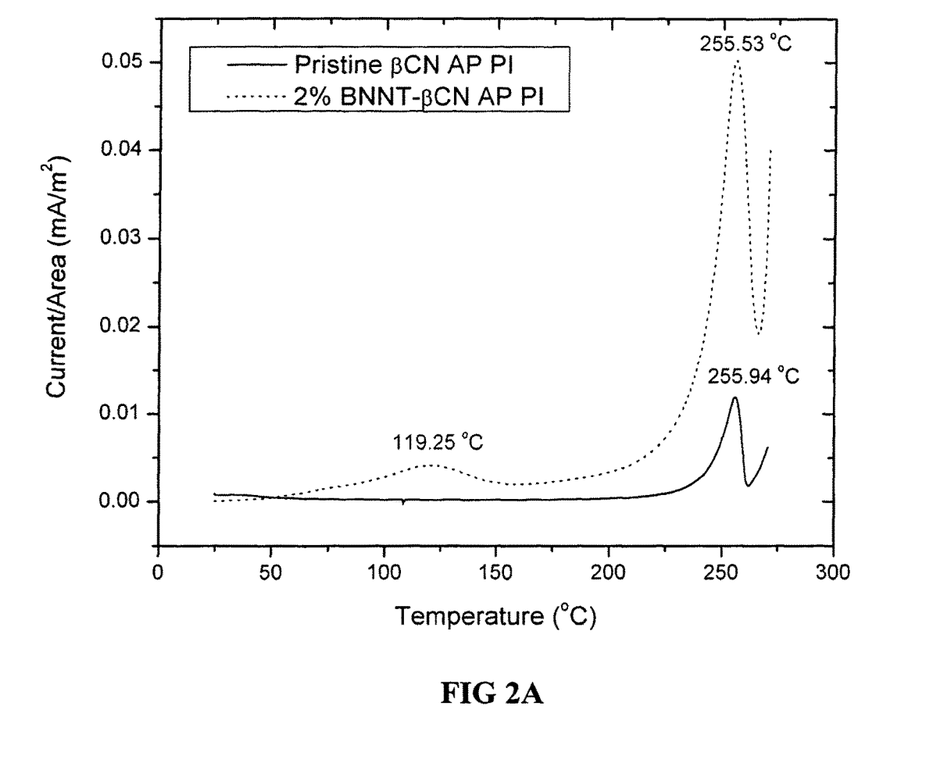
FIG. 2a shows a graph of thermally stimulated current (TSC) spectra of pristine polyimide and 2 wt % BNNT/polyimide composite.
Figure 2B:
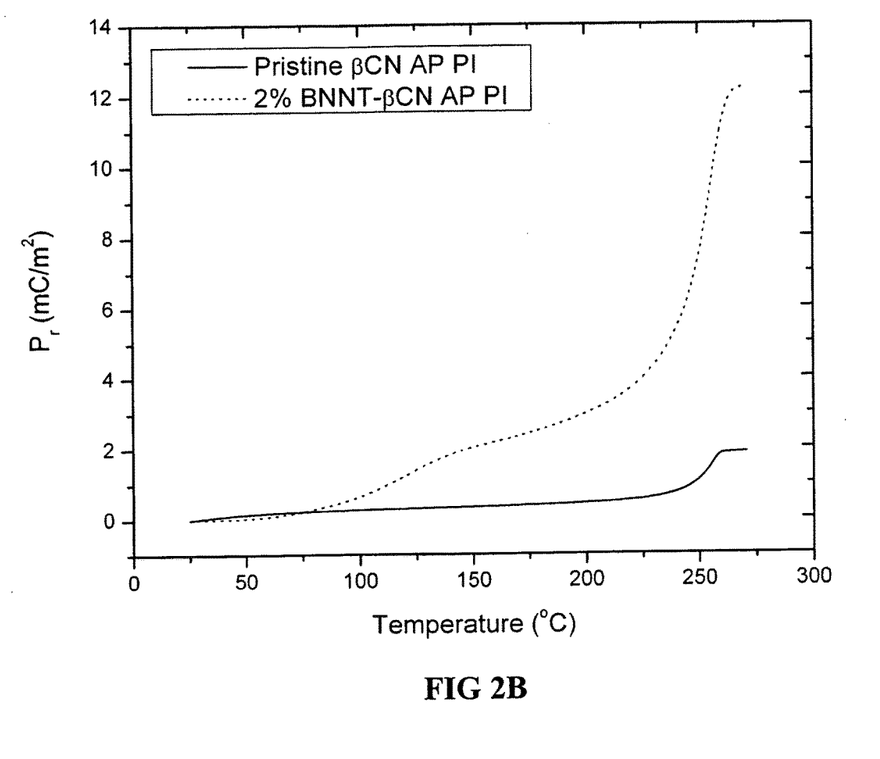
FIG. 2b shows a graph of remanent polarization ($P_r$) of pristine polyimide and 2 wt % BNNT/polyimide composite.

Thermally stimulated current (TSC) spectra of the BNNT nanocomposites were obtained using a Setaram TSC II. Each sample was polarized by a direct current (DC) electric field of 5 MV/m at an elevated temperature ($T_p=T_g-5°$ C.) for a selected poling time ($t_p=30$ min). The glass transition temperatures ($T_g$) of the pristine polyimide and 2% BNNT/polyimide composite, measured by a differential scanning calorimeter (DSC), are 274.3 and 271.4° C., respectively. After poling, the depolarization current was measured as the sample was heated through its glass transition temperature ($T_g$) at a heating rate of 7.0° C./min. As shown in FIG. 2a, the pristine polyimide showed negligible depolarization currents until about 225° C., which indicates a good thermal stability of polarization, and then exhibited a rapid depolarization current with a maximum peak of 0.012 mA/m² at 255.9° C. On the other hand, the 2 wt % BNNT/polyimide nanocomposite exhibited two depolarization peaks at 119.3° C. and 255.5° C. The magnitude of the depolarization current of the nanocomposite was significantly larger than that of the pristine polyimide as seen in FIG. 2b, and reached a maximum value of about 0.05 mA/m², five times greater than that of the pristine polyimide. The remanent polarization ($P_r$) was calculated by integrating the current with respect to time and is plotted as a function of temperature as shown in FIG. 2b. $P_r$ is given by, $$P_r = \frac{q}{A} = \frac{1}{A}\int I(t)dt \qquad (1)$$

where q is the charge, A is the electrode area, I is the current, and t is the time. Details of conventional poling procedures have been described elsewhere [J. H. Kang et al., NANO, 1, 77 (2006)]. The remanent polarization ($P_r$) of the 2 wt % BNNT/polyimide nanocomposite was 12.20 mC/m², almost an order of magnitude higher than that of the pristine polyimide (1.87 mC/m²). In general, the piezoelectricity of a material is proportional to its remanent polarization. From the TSC result, adding BNNT, even only 2 wt %, was proven to increase the piezoelectricity (remanent polarization) of the polyimide significantly.

Figure 3:
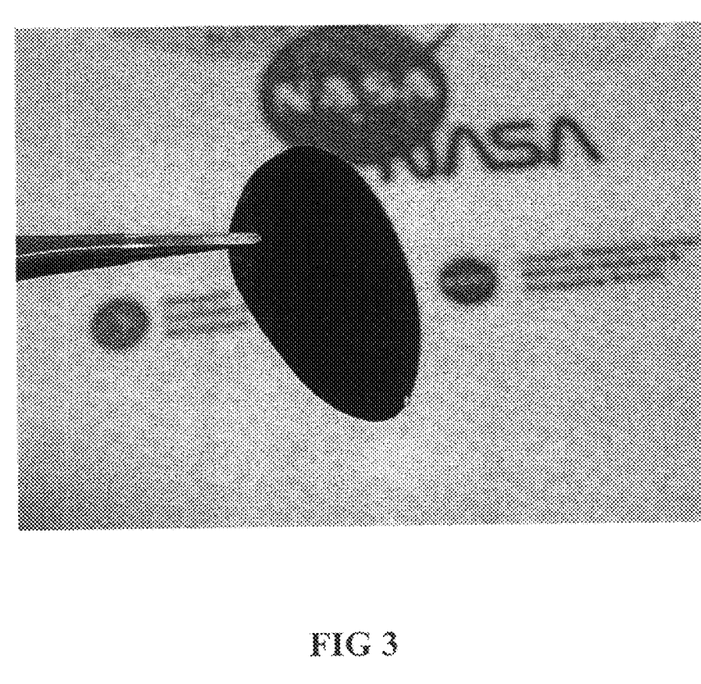
FIG. 3 shows a proto-type BNNT actuator fabricated with carbon nanotube electrodes.
Figure 4:
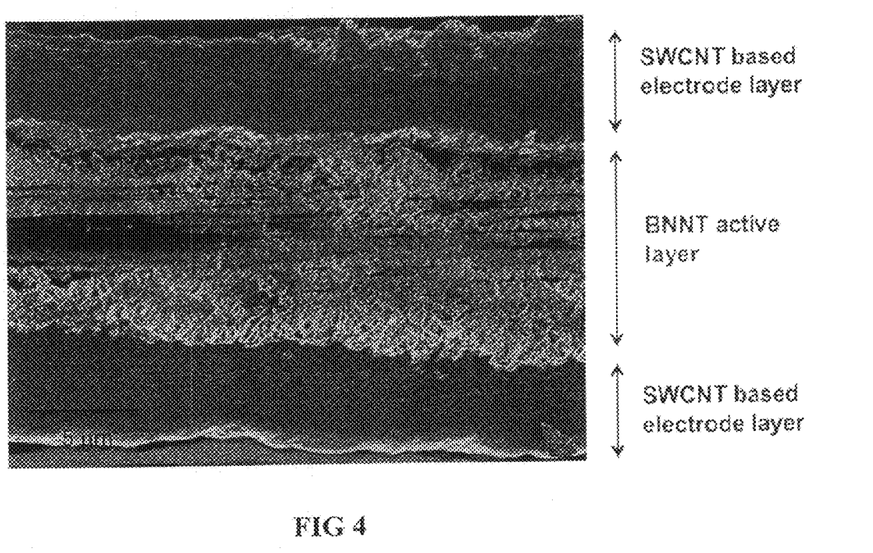
FIG. 4 shows a cross-sectional SEM image of a prototype BNNT actuator fabricated with carbon nanotube electrodes.

An all nanotube film actuator, with a BNNT active layer, was fabricated by a filtering method [J. H. Kang et al., *J. Polym. Sci. B: Polym Phys.* 46, 2532 (2008)]. Single wall carbon nanotubes (SWCNTs) were used as electrodes for the actuator instead of metal. First, solutions of SWCNTs and BNNTs were prepared in N-methylpyrrolidone (NMP) under sonication. An adequate amount of the SWCNT solution was filtered through the surface of an anodized alumina membrane (pore size: 0.2 µm) to form a SWCNT film on the membrane. Then, the BNNT solution and finally the SWCNT solution were sequentially filtered onto the SWCNTs film on the membrane to make a three layered (SWCNT/BNNT/SWCNT) "all-nanotube actuator" structure shown in FIG. 3. The freestanding all-nanotube actuator film, shown in FIG. 3, was easily delaminated by breaking the brittle membrane. To increase durability, polyurethane resin was infused into the all-nanotube actuator. FIG. 4 shows the cross-sectional scanning electron microscopy (SEM) image of a prototype BNNT actuator fabricated with SWCNT electrodes (Hitachi S-5200 Field Emission Scanning Electron Microscope). The top and bottom layers are SWCNT electrodes and the middle layer is the BNNT actuating layer.

Figure 5A:
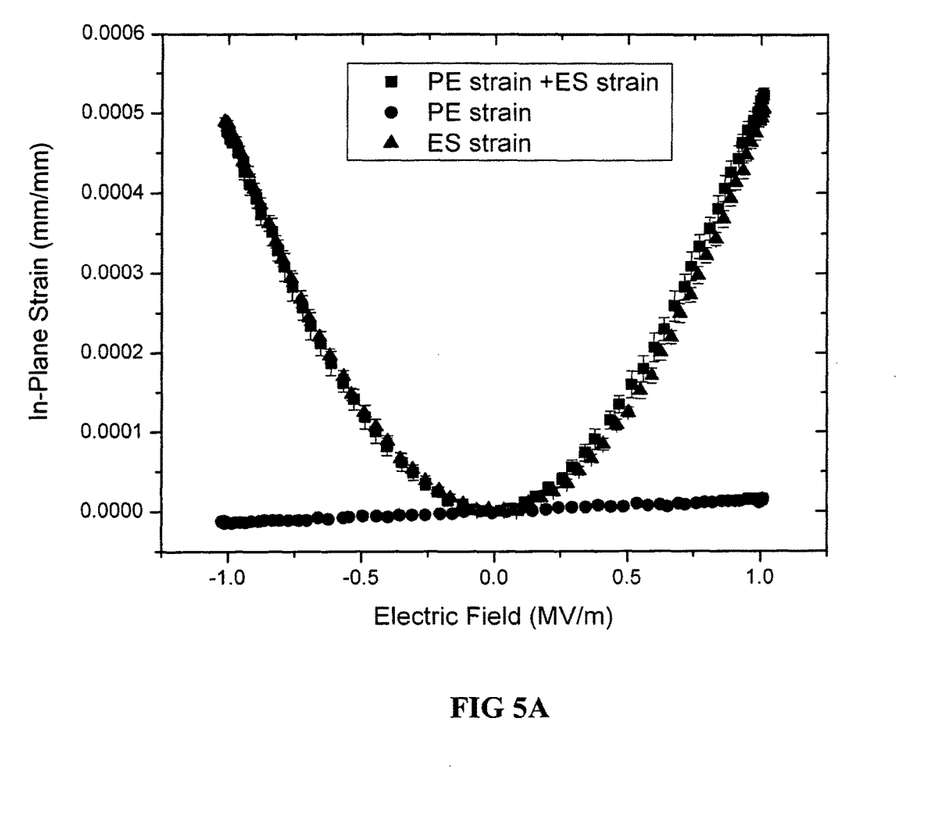
FIG. 5a shows a graph of the electric field induced strain of the BNNT actuator fabricated with CNT electrodes.
Figure 5B:
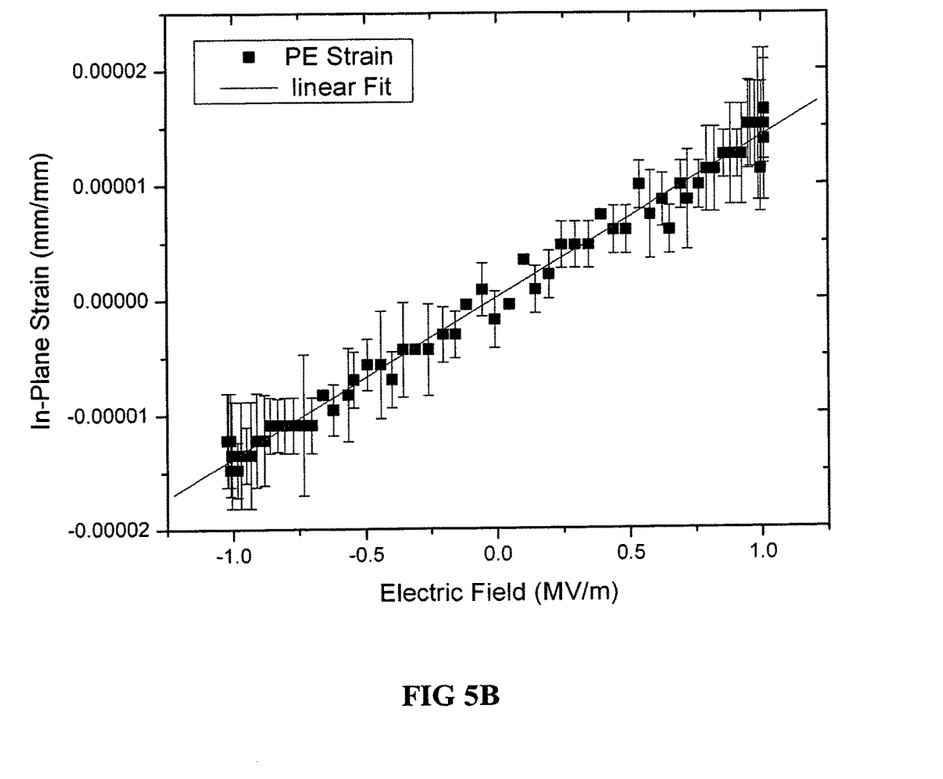
FIG. 5b shows a graph of the piezoelectric response of the BNNT actuator fabricated with CNT electrodes.
Figure 5C:
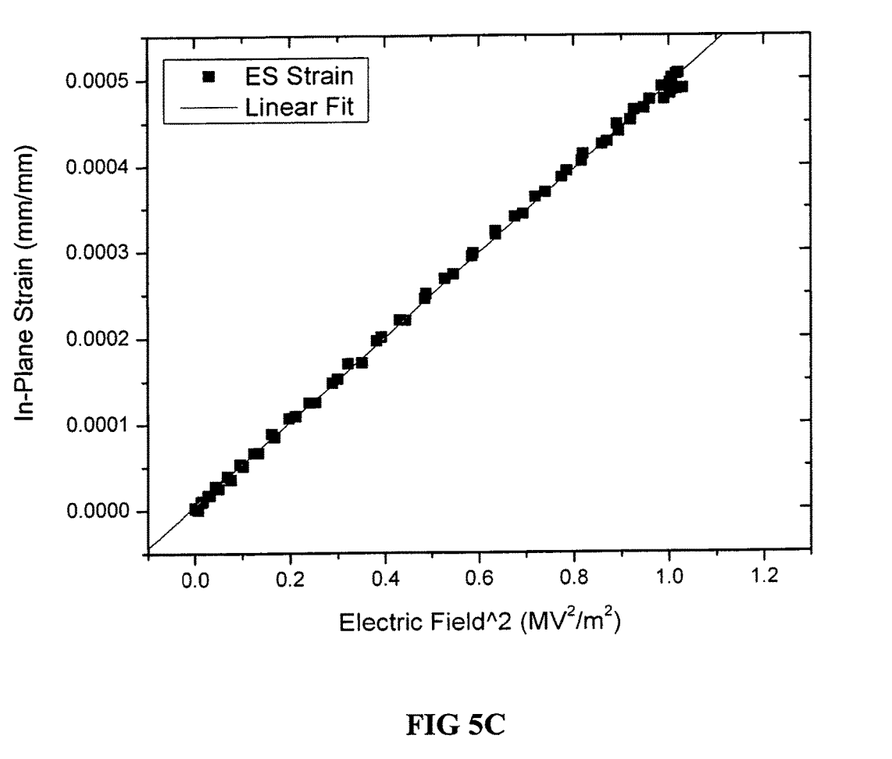
FIG. 5c shows a graph of the electrostrictive response of the BNNT actuator fabricated with CNT electrodes.

In-plane strain ($S_{13}$) was measured using a fiber optic device while the sample was under an alternating current (AC) electric field of 1 Hz. The strain ($S_{13}$) of the sample appears as a superposed curve (black solid squares in FIG. 5a) of linear and nonlinear strains as a function of frequency. The superposed curve was de-convoluted to a linear response (red solid circles in FIG. 5a) and a nonlinear response (blue solid triangles in FIG. 5a). The linear response seems to originate from the piezoelectric property of the BNNT active layer. From linear fitting of the data (FIG. 5b), the piezoelectric coefficient, $d_{13}$ was calculated to be about 14.80 pm/V. This is comparable to the values of commercially available piezoelectric polymers such as poly (vinylidene fluoride) (PVDF). The nonlinear response showed a quadratic increase with increasing applied electric field, indicating that the mechanism of this strain is mainly an electrostrictive response (FIG. 5c). The electrostrictive coefficient ($M_{13}$) of the BNNT active layer, calculated from the slope of a plot of the strain ($S_{13}$) to the square of electric field strength ($E^2$), $S_{13}=M_{13} E^2$, was $3.21\times10^{-16}$ pm$^2$/V$^2$ on average. This value is several orders of magnitude higher than those of electrostrictive polyurethanes ($-4.6\times10^{-18}$ to $-7.5\times10^{-17}$ m$^2$/V$^2$).

Obviously, many modifications may be made without departing from the basic spirit of the present invention. Accordingly, it will be appreciated by those skilled in the art that within the scope of the appended claims, the invention may be practiced other than has been specifically described herein. Many improvements, modifications, and additions will be apparent to the skilled artisan without departing from the spirit and scope of the present invention as described herein and defined in the following claims.

What is claimed is:

1. A method for forming a boron nitride nanotube nanocomposite comprising:
    combining a boron nitride nanotube solution with a matrix including at least one of a polymer or a ceramic to form a boron nitride nanotube nanocomposite;
    synthesizing the boron nitride nanotube nanocomposite film as an electroactive layer from the boron nitride nanotube nanocomposite such that when an electric power source coupled to said electroactive layer is actuated, a mechanical deflection is achieved due to an electroactive characteristic solely in the boron nitride nanotube nanocomposite in the electroactive layer; and
    forming a plurality of electrodes on the electroactive layer,
    wherein the boron nitride nanotube nanocomposite film is mechanically deflected when an electrical charge is applied, and electroactivity is achieved when the electrical charge is applied from the electric power source and the plurality of electrodes, and the boron nitride nanotube nanocomposite provides the electroactive characteristic.

2. The method of claim 1, wherein the matrix is synthesized from a diamine, 2,6-bis(3-aminophenoxy)benzonitrile (($\beta$-CN),APB) and a dianhydride, pyromellitic dianhydride (PNIDA).

3. The method of claim 1, wherein the polymer is selected from the group consisting of polyvinylidene fluoride, polyvinylidene fluoride copolymer, polycarbonate and epoxy.

4. The method of claim 1, wherein the polymer is selected from the group consisting of polyurethane and polysiloxane.

5. The method of claim 1, wherein the ceramic is selected from the group consisting of silicon dioxides and aluminum oxides.

6. The method of claim 1, wherein a concentration of boron nitride nanotubes in the boron nitride nanotube nanocomposite film is between 0 and 100% by weight.

7. The method of claim 1, wherein the forming of the plurality of electrodes includes coating the boron nitride nanotube nanocomposite film with metal electrodes.

8. The method of claim 7, wherein a metal for the metal electrodes is selected from the group consisting of chrome and gold.

9. The method of claim 7, wherein a metal for the metal electrodes include a mixture of chrome and gold.

10. The method of claim 1, wherein the forming of the plurality of electrodes includes coating the boron nitride nanotube nanocomposite film with compliant electrodes.

11. The method of claim 10, wherein the compliant electrodes are selected from the group consisting of carbon nanotubes, carbon nanotube sheeting, carbon nanotube/polymer composites, gold particles, and silver particles.

12. The method of claim 10, wherein the compliant electrodes are a mixture including one or more of carbon nanotubes, carbon nanotube sheeting, carbon nanotube/polymer composites, gold particles, and silver particles.

13. The method of claim 1, wherein a concentration of boron nitride nanotubes in the boron nitride nanotube nanocomposite film is 2% by weight.

14. A method for forming a boron nitride nanotube nanocomposite film, comprising:
    combining a boron nitride nanotube solution with a matrix including at least one of a polymer or a ceramic to form a boron nitride nanotube nanocomposite;
    synthesizing the boron nitride nanotube nanocomposite film as an electroactive layer from the boron nitride nanotube nanocomposite such that when a mechanical deflection is applied to the boron nitride nanotube nanocomposite film, an electrical charge is produced due to an electroactive characteristic solely in the boron nitride nanotube nanocomposite in the electroactive layer; and
    forming a plurality of electrodes on the electroactive layer,
    wherein the boron nitride nanotube nanocomposite produces said electrical charge when mechanically deflected, and electroactive properties and the plurality of electrodes enable the electrical charge to be generated when the boron nitride nanotube nanocomposite film is mechanically deflected.

15. The method of claim 14, wherein the matrix is synthesized from a diamine, 2,6-bis(3-aminophenoxy)benzonitrile (($\beta$-CN)APB) and a dianhydride, pyromellitic dianhydride (PMDA).

16. The method of claim 14, wherein the polymer is selected from the group consisting of polyvinylidene fluoride, polyvinylidene fluoride copolymer, polycarbonate and epoxy.

17. The method of claim 14, wherein the polymer is selected from the group consisting of polyurethane and polysiloxane.

18. The method of claim 14, wherein the ceramic is selected from the group consisting of silicon dioxides and aluminum oxides.

19. The method of claim 14, wherein a concentration of boron nitride nanotubes in the boron nitride nanotube nanocomposite film is between 0 and 100% by weight.

20. The method of claim 14, wherein the forming of the plurality of electrodes includes coating the boron nitride nanotube nanocomposite film with metal electrodes.

21. The method of claim 20, wherein a metal for the metal electrodes is selected from the group consisting of chrome and gold.

22. The method of claim 20, wherein a metal for the metal electrodes include a mixture of chrome and gold.

23. The method of claim 14, wherein the forming of the plurality of electrodes includes coating the boron nitride nanotube nanocomposite film with compliant electrodes.

24. The method of claim 23, wherein the compliant electrodes are selected from the group consisting of carbon nanotubes, carbon nanotube sheeting, carbon nanotube/polymer composites, gold particles, and silver particles.

25. The method of claim 23, wherein the compliant electrodes is a mixture including one or more of carbon nanotubes, carbon nanotube sheeting, carbon nanotube/polymer composites, gold particles, and silver particles.

26. The method of claim 14, wherein a concentration of boron nitride nanotubes in the boron nitride nanotube nanocomposite film is 2% by weight.

* * * * *

UNITED STATES PATENT AND TRADEMARK OFFICE
CERTIFICATE OF CORRECTION

PATENT NO. : 10,435,293 B2
APPLICATION NO. : 12/925047
DATED : October 8, 2019
INVENTOR(S) : Jin Ho Kang et al.

Page 1 of 1

It is certified that error appears in the above-identified patent and that said Letters Patent is hereby corrected as shown below:

In the Claims

Claim 1, Line 2, Column 5, Line 53, after "composite" insert --film--

Claim 2, Line 4, Column 6, Line 9, change "(PNIDA)" to --(PMDA)--

Signed and Sealed this
Twelfth Day of November, 2019

Andrei Iancu
*Director of the United States Patent and Trademark Office*